(12) United States Patent
Tsukagoshi

(10) Patent No.: US 7,709,856 B2
(45) Date of Patent: May 4, 2010

(54) SEMICONDUCTOR LIGHT EMITTING DEVICE EXCELLENT IN HEAT RADIATION

(75) Inventor: Kohji Tsukagoshi, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 69 days.

(21) Appl. No.: 11/947,844

(22) Filed: Nov. 30, 2007

(65) Prior Publication Data
US 2008/0258171 A1 Oct. 23, 2008

(30) Foreign Application Priority Data
Dec. 5, 2006 (JP) ............................. 2006-328738

(51) Int. Cl.
*H01L 33/00* (2006.01)
(52) U.S. Cl. ............... 257/100; 257/99; 257/E33.059; 257/E33.058
(58) Field of Classification Search .............. 257/99, 257/100, 712, 787, E33.055, E33.056, E33.057, 257/E33.058, E33.059, E33.075
See application file for complete search history.

(56) References Cited
U.S. PATENT DOCUMENTS
6,924,514 B2 * 8/2005 Suenaga ..................... 257/98

2005/0236638 A1* 10/2005 Tsukagoshi ................. 257/99
2007/0145383 A1* 6/2007 Rho et al. ................... 257/79
2007/0215895 A1* 9/2007 Amoh et al. ................. 257/99

* cited by examiner

*Primary Examiner*—Victor A Mandala
*Assistant Examiner*—Scott Stowe
(74) *Attorney, Agent, or Firm*—Bachman & LaPointe, P.C.

(57) ABSTRACT

A semiconductor light emitting device is provided which comprises: a semiconductor light emitting chip 2 mounted on a top surface 12 of a support plate 1, wiring conductors 3 disposed adjacent to side surfaces 11 of support plate 1, and a plastic encapsulant 6 for sealing side surfaces 11 of support plate 1 and wiring conductors 3. Each of wiring conductors 3 has one end 13 electrically connected to an electrode 2a of semiconductor light emitting chip 2 and the other end 14 extending away from support plate 1. Plastic encapsulant 6 is formed with openings 7 upwardly extending from a bottom surface 6b of plastic encapsulant 6 between side surface 11 of support plate 1 and an outer surface 6c of plastic encapsulant 6 to open each bottom surface 3b of wiring conductors 3 to the outside through opening 7 so that heat from semiconductor light emitting chip 2 can effectively be radiated to the outside through wiring conductors 3 and opening 7 when a large current is supplied to semiconductor light emitting chip 2 to turn it on with a high brightness.

7 Claims, 7 Drawing Sheets

SEMICONDUCTOR LIGHT EMITTING DEVICE EXCELLENT IN HEAT RADIATION

TECHNICAL FIELD

This invention relates to a semiconductor light emitting device, in particular, of the type capable of efficiently radiating heat from a semiconductor light emitting element to the outside of a plastic encapsulant.

BACKGROUND OF THE INVENTION

A semiconductor light emitting device is known which comprises a metallic support plate, a semiconductor light emitting element secured on the support plate, wiring conductors disposed adjacent to a top or side surfaces of the support plate to extend away from the support plate and a plastic encapsulant for sealing side surfaces of the support plate and wiring conductors. Each one end of the wiring conductors is electrically connected to a top electrode of the semiconductor light emitting element and each the other end of the wiring conductors is led out of the plastic encapsulant.

Recently, attempts have been made to apply the semiconductor light emitting devices of this kind to a light source of tail lamps or the like for automobiles, and in such a case, the light emitting devices have to light up at such an intensified emission level as to be able to positively observe lighting up or out of the devices from a distance. To this end, a semiconductor light emitting device of high optical output has been developed which can produce a light of high brightness when relatively large electric current of for example more than 350 mA is supplied through the semiconductor light emitting element as a result of study on materials and structures of the element. However, when a large electric current over 350 mA is delivered to the light emitting element, it produces an increased amount of heat during operation so that surfaces of semiconductor light emitting element may exceed a temperature of 150° C. Prior art semiconductor light emitting devices cannot produce light of high brightness because it cannot efficiently radiate heat generated from the light emitting element.

By way of example, U.S. Patent Publication 2005/0236638 to Kohji Tsukagoshi published Oct. 27, 2005 discloses a semiconductor light emitting device which comprises a support plate and a plastic encapsulant for sealing the support plate. The plastic encapsulant is formed with notches on opposite sides of the plastic encapsulant and on a bottom side of the support plate to lead each outer end of wiring conductors out of the plastic encapsulant through the notches so that exposed length of wiring conductors can be extended to the outside of the plastic encapsulant by these notches to discharge more amount of heat from the semiconductor light emitting element through the wiring conductors.

Even with the improved radiation of heat from the semiconductor light emitting element from the other end of wiring conductors, the device still cannot sufficiently release heat from semiconductor light emitting element to the outside of plastic encapsulant.

Therefore, an object of the present invention is to provide a semiconductor light emitting device capable of dissipating a full amount of heat from a semiconductor light emitting element through wiring conductors when the light emitting element is turned on with a large current flowing through the light emitting element.

SUMMARY OF THE INVENTION

The semiconductor light emitting device according to the present invention comprises: a support plate (1), a semiconductor light emitting element (2) mounted on a top surface (12) of support plate (1), wiring conductors (3) disposed adjacent to at least one side or top surface (11, 28, 12) of support plate (1), and a plastic encapsulant (6) for sealing at least one side surface (11, 28) of support plate (1) and each one end of wiring conductors (3). Each of wiring conductors (3) has one end (13) electrically connected to an electrode (2a) of semiconductor light emitting element (2) and the other end (14) extending away from support plate (1). Plastic encapsulant (6) is formed with at least one opening (7) upwardly extending from a bottom surface (6b) of plastic encapsulant (6) between side surface (11, 28) of support plate (1) and an outer surface (6c) of plastic encapsulant (6) to exteriorly expose each bottom surface (3b) of wiring conductors (3). In this arrangement, each bottom surface (3b) of wiring conductors (3) is open to the outside through opening (7) so that heat from semiconductor light emitting element (2) can effectively be radiated to the outside through wiring conductors (3) and opening (7) when a large current is supplied to semiconductor light emitting element (2) to turn it on with a high brightness.

BRIEF DESCRIPTION OF THE DRAWINGS

The above-mentioned and other objects and advantages of the present invention will be apparent from the following description in connection with preferred embodiments shown in the accompanying drawings wherein.

BEST MODE FOR CARRYING OUT THE INVENTION

Embodiments of the present invention applied to light emitting diodes or LEDs of high optical output type will be described hereinafter in connection with FIGS. 1 to 14 of the drawings.

Figure 1:
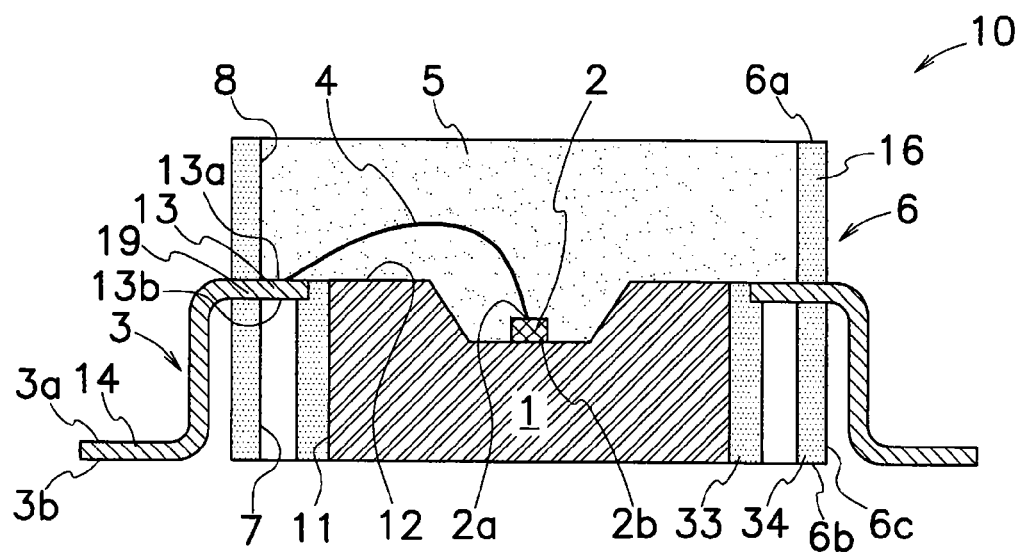
FIG. 1 is a sectional view taken along a line I-I of FIG. 6 showing a light emitting diode of an embodiment according to the present invention.
Figure 2:
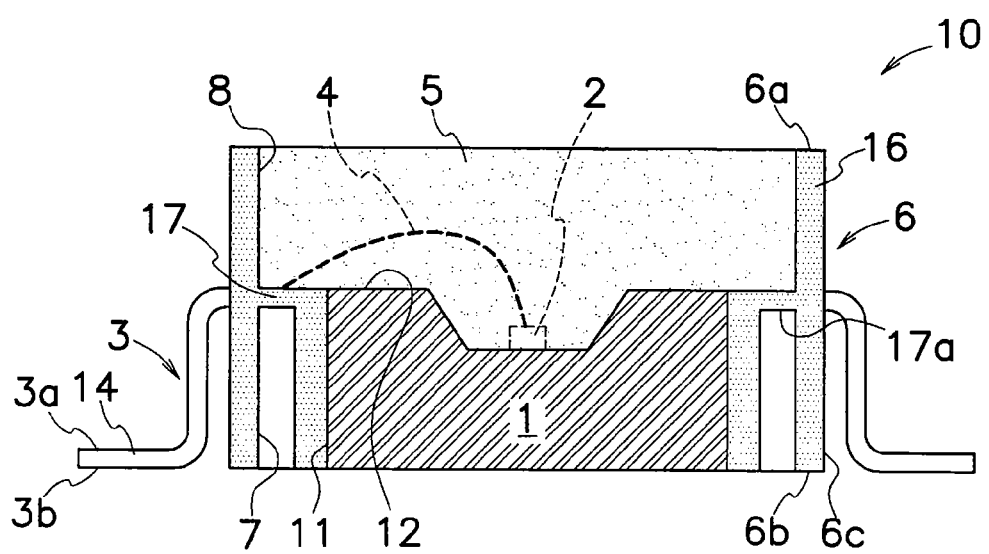
FIG. 2 is a sectional view taken along a line II-II of FIG. 6.
Figure 3:
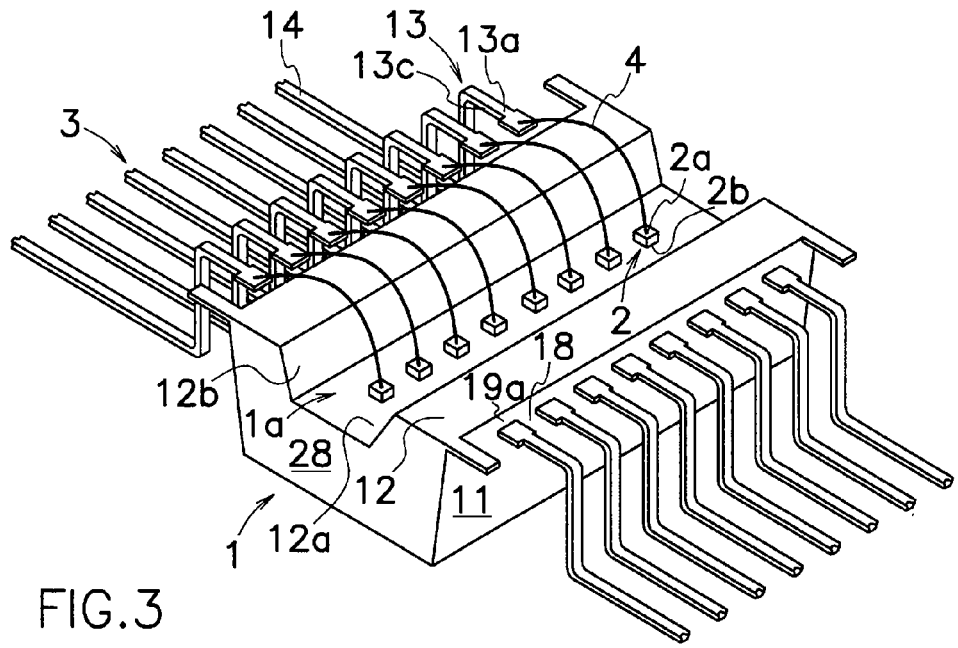
FIG. 3 is a perspective view from above of the light emitting diode shown in FIG. 1 with removal of a plastic encapsulant.
Figure 4:
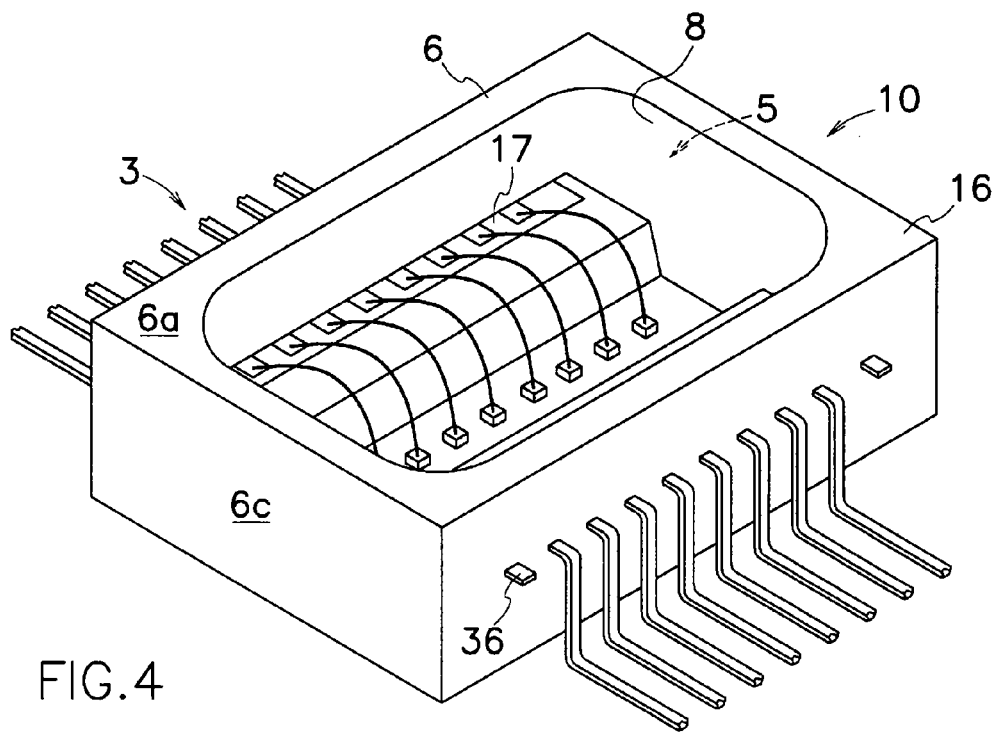
FIG. 4 is a perspective view from above of the light emitting diode shown in FIG. 1.

As shown in FIGS. 1 to 4, a light emitting diode 10 according to the present invention comprises a metallic support plate 1, a light emitting diode chip 2 as a light emitting element secured on a top surface 12 of support plate 1, wiring conductors 3 disposed in the vicinity of opposite side surfaces 11 of support plate 1 to extend outwardly of support plate 1, a lead wire 4 for electrically connecting each top electrode 2a of light emitting diode chip 2 with each top surface 3a of wiring conductors 3, and a plastic encapsulant 6 for sealing side surfaces 11 and 28 of support plate 1 and each one or inner end 13a of wiring conductors 3. FIG. 4 illustrates the finished light emitting diode 10, FIG. 3 depicts light emitting diode 10 with removed plastic encapsulant 6, and FIGS. 1 and 2 represent sectional views taken along lines respectively I-I and II-II of FIG. 6. Shown diode 10 has eight light emitting diode chips 2 and sixteen wiring conductors 3 apposed on opposite sides of diode chips 2 along both side surfaces 11 of support plate 1.

Support plate 1 and wiring conductors 3 are preferably formed of metallic material of high coefficient of thermal conductivity such as copper, aluminum, copper alloy or aluminum alloy. If support plate 1 and wiring conductors 3 are formed of a metallic material of high coefficient of thermal conductivity, they assure that the device can shine with high brightness because a large electric current can be sent to light emitting diode chip 2 through wiring conductors 3 while support plate 1 and wiring conductors 3 can effectively discharge heat from light emitting diode chip 2 to the outside. As shown in FIG. 3, support plate 1 comprises a pair of longitudinal side surfaces 11, a pair of lateral side surfaces 28 shorter than longitudinal side surfaces 11, a top surface 12 and a bottom surface 15 (FIG. 5) all of which form support plate 1 into a generally rectangular parallelepiped. A longitudinal groove 1a is formed on top surface 12 across opposite lateral side surfaces 28 along a longitudinal central line of top surface 12. Longitudinal groove 1a is formed with a flat mounting surface 12a, and a pair of inner side walls 12b. Light emitting diode chips 2 are deployed in line on a mounting surface 12a of longitudinal groove 1a between inner side walls 12b each which has inner slant surface upwardly diverging away from mounting surface 12a so that inner slant surfaces provide a light reflector to improve light directivity and axial brightness of light emitting diode 2. Flat bottom surface 15 of support plate 1 is exposed to the outside from bottom surface 6b of plastic encapsulant 6. Each of wiring conductors 3 is formed of a metallic strip or rod having its quadrate or rectangular cross section with one end 13 of larger area than that of the other end 14 so that one end 13 provides a bonding pad on which one end of lead wire 4 is bonded for electric connection. Otherwise, wiring conductors 3 may be formed into a circular cross section. Each one end 13 of wiring conductors 3 is electrically connected to a top electrode 2a or bottom electrode 2b of light emitting diode chip 2, and the other end of wiring conductors 3 is led out of plastic encapsulant 6.

Plastic encapsulant 6 is formed of opaque or translucent resin of high melting point mixed with filler or compound such as silica of relatively large content rate into a generally rectangular parallelepiped as shown in FIG. 4. Alternatively, plastic encapsulant 6 may be formed of heat-resistible and thermosetting black epoxy resin mixed with a compound of more amount than that contained in light transmissive resin as used in forming a plastic package for power transistors. Accordingly, adhesive property of such a plastic encapsulant 6 hardly so deteriorates even if heat from light emitting diode chip 2 is continuously applied to plastic encapsulant 6. Thus, neither gap nor clearance is produced between plastic encapsulant 6 and wiring conductors 3, and therefore, the device shows good environmental resistance for a long time and provides a reliable light emitting diode capable of producing high optical output. Otherwise, plastic encapsulant 6 may be formed of white epoxy resin blended with filler such as silica, titanium or boron nitride resistible to heat or ultraviolet rays.

Plastic encapsulant 6 has four outer side walls 6c upwardly extending from top surface 12 of support plate 1 to form elongation walls 16 which surround semiconductor light emitting diode 2 and simultaneously form a hole 8 encircled by elongation walls 16. A light transmissive resin 5 is filled in longitudinal groove 1a of support plate 1 and hole 8 to seal top surface 12 of support plate 1, light emitting diode chips 2, lead wires 4 and top surface 3a of wiring conductor's inner end 13a. When plastic encapsulant 6 is formed of light reflective material such as white resin, elongation walls 16 serve as light reflectors to improve light directivity and axial brightness of light emitting diode chip 2 in addition to longitudinal groove 1a of support plate 1. Elongation walls 16 serve to reinforce mechanical strength of plastic encapsulant 6 and reduce or alleviate mechanical stress applied from outside on light emitting diode 10 because elongation walls 16 are integrally formed with outer side walls 6c. When transparent or translucent light transmissive resin 5 is filled in a united internal space which includes hole 8 of plastic encapsulant 6 and longitudinal groove 1a of support plate 1, elongation walls 16 serve to prevent leakage of light transmissive resin 5 out of plastic encapsulant 6 and facilitate and ensure filling of light transmissive resin 5 in hole 8 and longitudinal groove 1a. Light transmissive resin 5 is selected from groups of resins having their high refraction index and high optical transparency for example thermally-resistant silicone resin. Light transmissive resin 5 serves to protect light emitting diode chips 2 and lead wires 4. An optically transparent coating material such as polymetaloxane or ceramic may be filled in hole 8 and longitudinal groove 1a.

Figure 5:
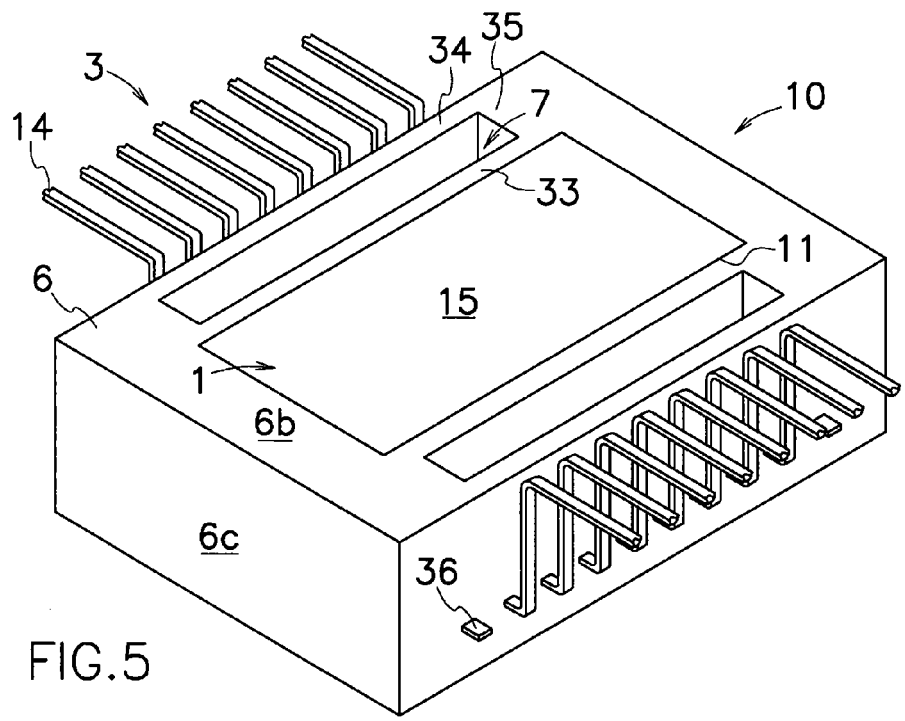
FIG. 5 is a perspective view from beneath.
Figure 6:
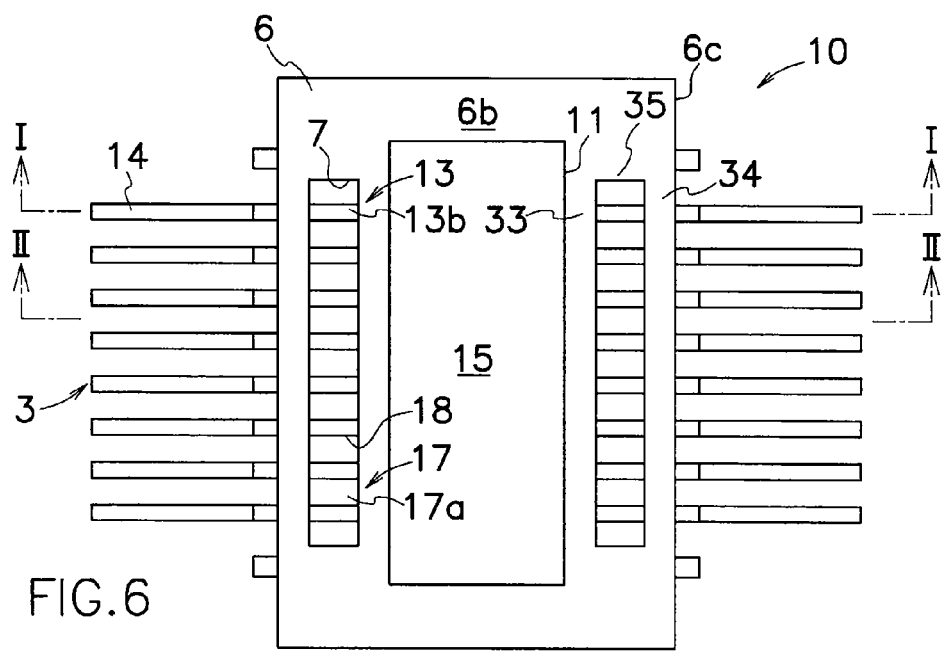
FIG. 6 is a bottom view of the diode shown in FIG. 1.
Figure 7:
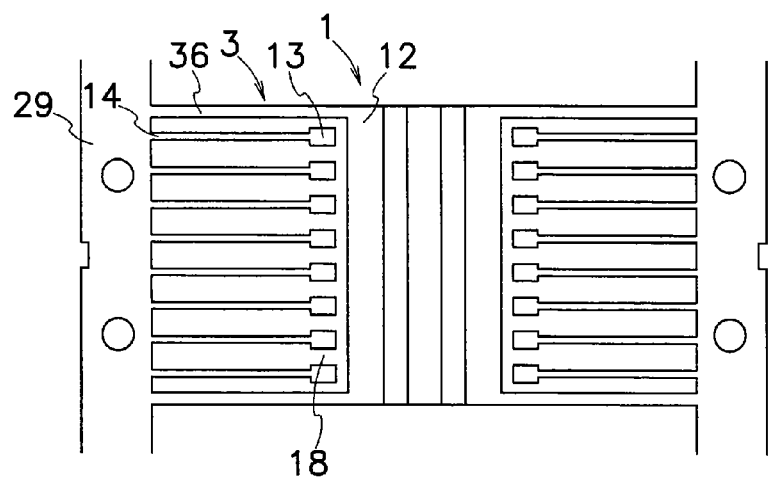
FIG. 7 is a plan view of a lead frame used in forming the diode shown in FIG. 1.

As shown in FIGS. 5 and 6, plastic encapsulant 6 has two openings 7 formed between side surfaces 11 of support plate 1 and outer side walls 6c of plastic encapsulant 6 upwardly extending from bottom surface 6b toward top surface 6a of plastic encapsulant 6 to expose to the outside each bottom surface 3b of wiring conductors 3 through openings 7. When a large electric current is supplied to light emitting diode chip 2 through wiring conductors 3 to turn it on with the high brightness, heat from light emitting diode chip 2 can be discharged to the outside through wiring conductors 3 and openings 7 and naked bottom surface 15 of support plate 1.

In this embodiment shown in FIGS. 1 to 4, each lead wire 4 of light emitting diode 10 electrically connects top electrode 2a of corresponding light emitting diode 2 with upper surface 13a of wiring conductor's one end 13 whose bottom surface 13b is exposed to the outside through opening 7. Lighting diode chip 2 produces a large amount of heat which heats one end 13 of wiring conductor 3 in the vicinity of diode chip 2 to a high temperature, however, heat retained in diode chip 2 and wiring conductor 3 is effectively released to the outside through bottom surface 13b of wiring conductor 3 and opening 7. In this case, one end of lead wire 4 is bonded on a connection area of wiring conductor 3, and bottom surface of the connection area is open to the outside through opening 7 as shown in FIG. 1 to radiate to the outside through opening 7 heat transferred through lead wire 4 and wiring conductor 3.

As shown in FIG. 3, adjoining one ends 13 of wiring conductors 3 are disposed away from each other to form a longitudinal gap 18, and also each one end 13 of wiring conductors 3 is disposed away from side surface 11 of support plate 1 to form a lateral gap 19a. Plastic encapsulant 6 is filled in these gaps 18 and 19a to form a joint resin 17 for providing a sealing and electric insulation structure which may prevent entry of foreign matter into hole 8 through opening 7, gaps 18 and 19a. In addition, joint resin 17 advantageously hinders leakage of light transmissive resin 5 to the outside through gaps 18 and 19a so that light transmissive resin 5 can be well filled in hole 8 defined by elongation walls 16 of plastic encapsulant 6 without leakage.

As shown in FIGS. 1, 5 and 6, each opening 7 of plastic encapsulant 6 is defined by an inner wall 33 which encapsulates longitudinal side surface 11 of support plate 1 and each one end 11 of wiring conductors 3, an outer wall 34 which seals one end 13 and intermediate portion 19 of each wiring conductor 3 and a connecting wall 35 which unites inner and outer walls 33 and 34. Inner wall 33 of plastic encapsulant 6 formed between each one end 13 of wiring conductors 3 and support plate 1 ensures electric insulation between support plate 1 and wiring conductors 3. Plastic encapsulant 6 seals four side surfaces 11 and 28 of support plate 1 to firmly hold support plate 1 therein while hindering movement of support plate 1 relative to plastic encapsulant 6 which may disadvantageously produce malfunction such as electric disconnection, damage or break of lead wires 4. Each opening 7 forms a pocket of rectangular parallelepiped shape to expose bottom surface 3b of wiring conductors 3 to the outside, and joint resin or connection 17 has a flat bottom surface 17a flush with bottom surface 13b of wiring conductors 3. Thus, each one end 13 of wiring conductors 3 is covered with plastic encapsulant 6 except bonding pad of wiring conductors 3 open to hole 8 of plastic encapsulant 6 and bottom surface 13b of wiring conductor's one end 13 open to opening 7 of plastic encapsulant 6.

Figure 8:
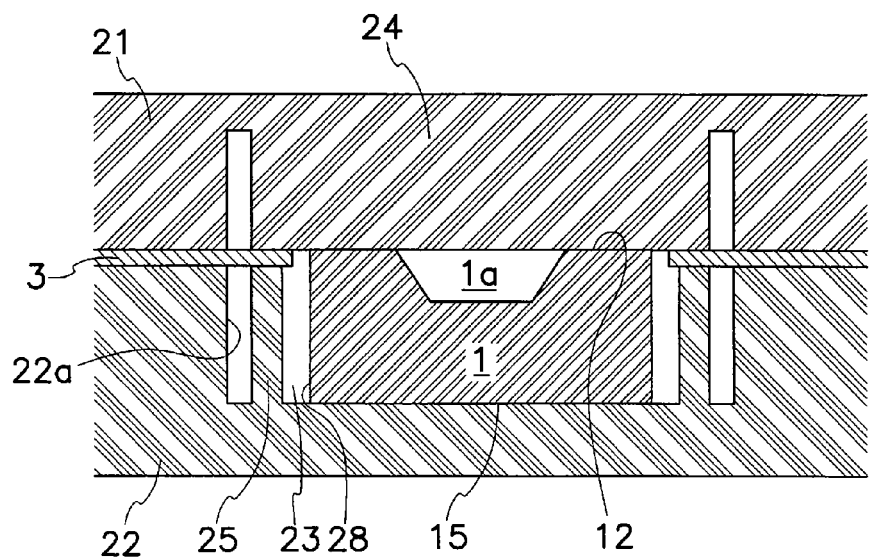
FIG. 8 is a sectional view of a forming mold to which the lead frame of FIG. 7 is attached.

In preparing light emitting diode 10, plural sets of support plate 1 and wiring conductors 3 are simultaneously punched out into lead frames utilizing a well-known press working of metallic strips. A lead frame shown in FIG. 7 includes two rows of wiring conductors 3 the other ends 14 of which are connected each other by coupling strips 29, and a support plate 1 disposed between wiring conductors 3 and connected with coupling strips 29 by connecting bars 36. Then, well-known transfer molding technique is used to form a plastic encapsulant 6 which encapsulates top surface 12 of support plate 1, side surfaces 11 and 28 and one end of wiring conductors 3. The resultant lead frame is attached in a cavity 23 defined by forming molds 21 and 22 as shown in FIG. 8 while support plate 1 and wiring conductors 3 are firmly grasped between forming molds 21 and 22.

An upper mold 21 of forming molds has a downwardly extending and flat protrusion 24 which is brought into contact to top surface 12 of support plate 1 when forming molds are closed to tightly seal longitudinal groove 1a with flat protrusion 24. On the other hand, a lower mold 22 of forming molds has a pair of upwardly extending lugs 25 which are brought into contact to wiring conductors 3 when forming molds are closed. When bottom surface 15 of support plate 1 is disposed on lower mold 22 in cavity 23, lug 25 of lower mold 22 is located between side surface 22a of lower mold 22 and longitudinal side surface 11 of support plate 1. Although not shown in the drawings, but a plastic cover may be inserted between top surface 12 of support plate 1 and upper mold 21 to cover longitudinal groove 1a of support plate 1 with plastic cover.

In this condition, liquid resin is injected under pressure into cavity 23 through a runner and gate not shown, and lugs 25 of lower mold 22 serve to form openings 7 in molded plastic encapsulant 6 but liquid resin does not enter longitudinal groove 1a of support plate 1. After the liquid resin is cured, lead frame with molded plastic encapsulant 6 is removed from cavity 23 of forming molds 21 and 22.

In this embodiment, before or after the molding process of plastic encapsulant 6, light emitting diode chips 2 are secured on mounting surface 12a of support plate 1 by means of blazing material such as solder not shown utilizing a well-known die-bonder, and then, one and the other ends of each lead wire 4 are bonded respectively on top electrode 2a of each light emitting diode chip 2 and each one end 13 of wiring conductor 3 to electrically connect light emitting diode chip 2 and wiring conductor 3 utilizing a well-known wire-bonding technique. Then, light-transmissive resin 5 is poured into and filled in an inner space of united hole 8 and longitudinal groove 1a of support plate 1 by means of a well-known dispenser. Subsequently, unnecessary portions such as coupling strips 29 are removed from lead frame and the other ends 14 of wiring conductors 3 are bent into a predetermined shape to finish light emitting diode 10 shown in FIG. 4.

Figure 9:
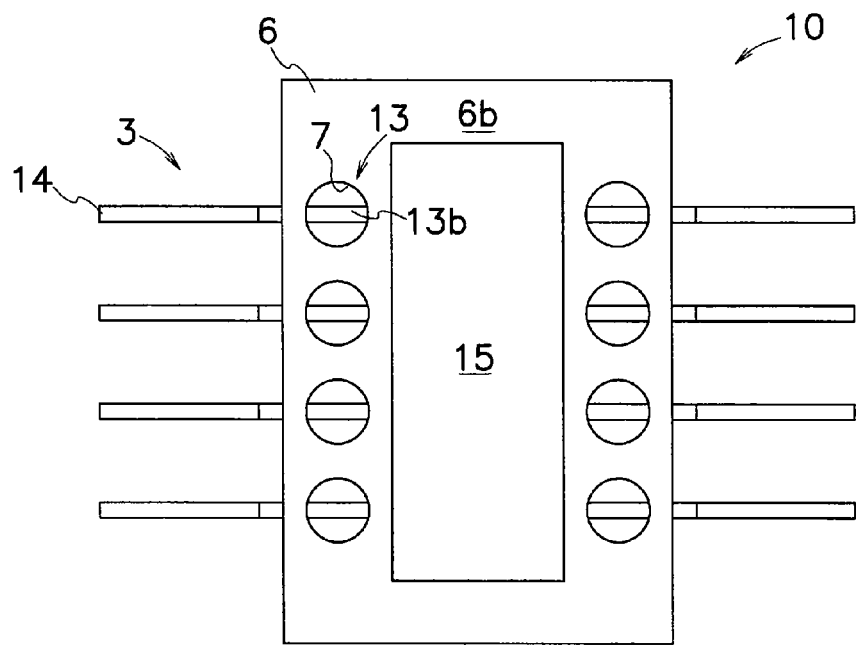
FIG. 9 is a bottom view of a light emitting diode showing another embodiment according to the present invention with a plastic encapsulant formed with openings of circular section.

Embodiments of the present invention may be modified in various ways without limitation to the foregoing embodiment. Number and shape of openings 7 in plastic encapsulant 6 can be selected as necessary, and for example, as shown in FIG. 9, each opening 7 in plastic encapsulant 6 can be formed into a cylindrical shape addressing corresponding wiring conductor 3.

Figure 10:
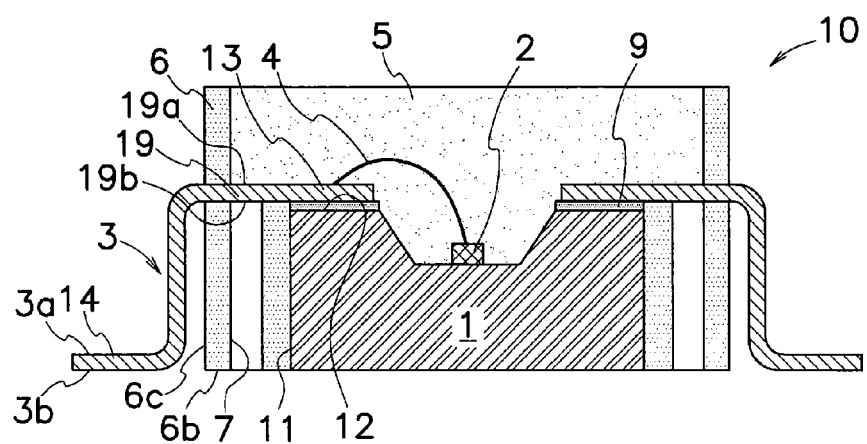
FIG. 10 is a sectional view of a light emitting diode showing still another embodiment according to the present invention with wiring conductors having their exposed intermediate portions through openings.

In light emitting diode 10 shown in FIG. 10, insulators 9 such as insulating tapes are attached on top surface 12 of support plate 1 and one ends 13 of bent wiring conductors 3 are attached on top surface 12 of support plate 1 through insulators 9. As in a similar manner to the above, lead wire 4 electrically connects top electrode 2a of light emitting diode chip 2 and top surface 13a of one end 13 of wiring conductor 3, and bottom surface 19b of intermediate portion 19 of wiring conductor 3 is exposed to the outside through cylindrical opening 7, but upper surface 19a of intermediate portion 19 of wiring conductor 3 is sealed by light transmissive resin 5. In any event, wiring conductors 3 are apposed along top surface 12 of support plate 1 and outer side surface 6c of plastic encapsulant 6. In lieu of insulating tapes, insulating resin may be applied on top surface 12 of support plate 1 to form isolation films as insulators 9 for electrically insulating support plate 1 and wiring conductors 3. As the case may be, insulators 9 can be integrally formed with plastic encapsulant 6 with the same plastic material.

Figure 11:
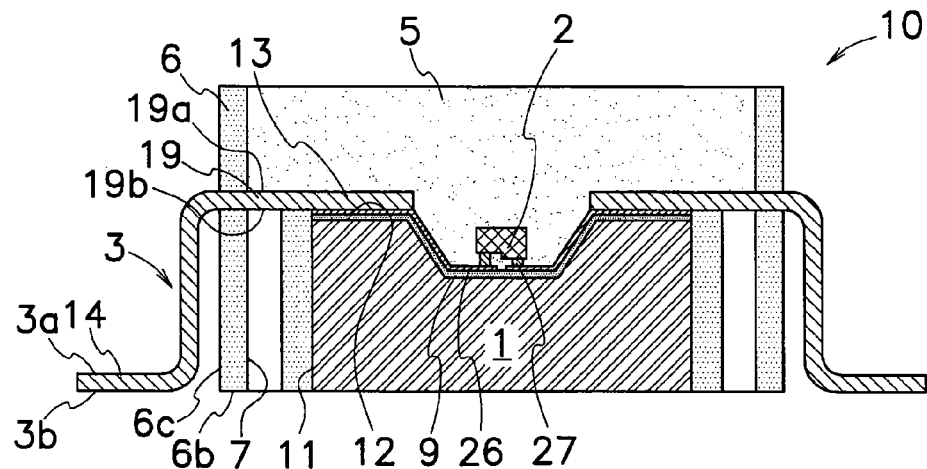
FIG. 11 is a sectional view of a light emitting diode showing a further embodiment according to the present invention with metallic films sandwiched between a support plate and wiring conductors.
Figure 12:
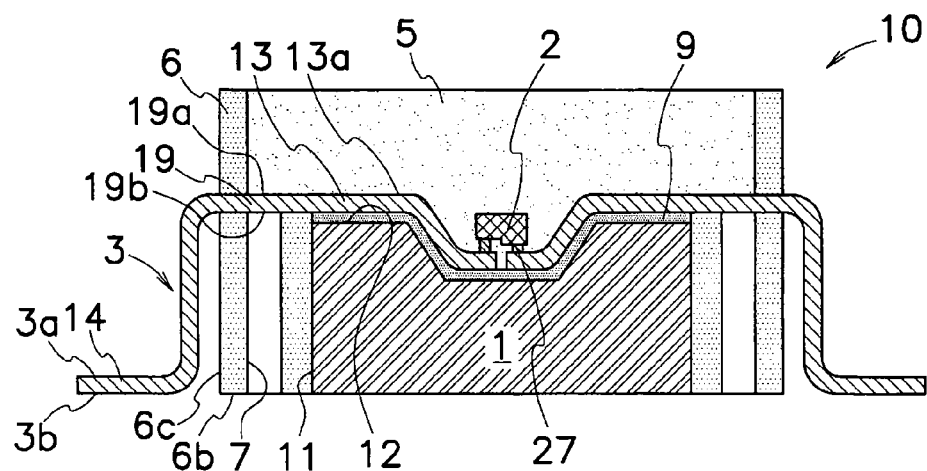
FIG. 12 is a sectional view of a light emitting diode showing a still further embodiment according to the present invention with a light emitting diode whose bottom electrodes are directly connected to wiring conductors.
Figure 13:
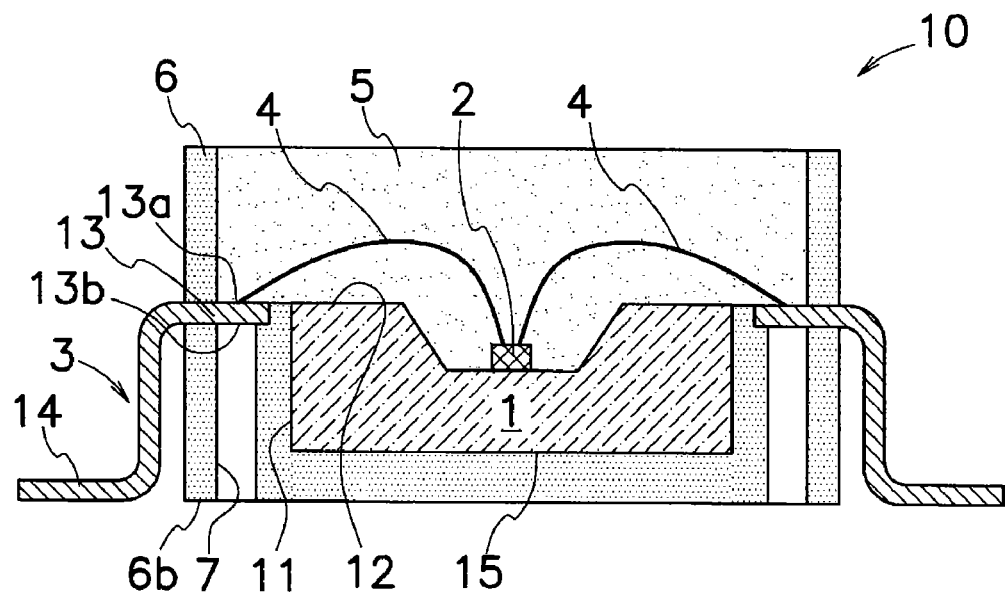
FIG. 13 is a sectional view of a light emitting diode showing a diverse embodiment according to the present invention with two lead wires connecting electrodes of a light emitting diode with wiring conductors.
Figure 14:
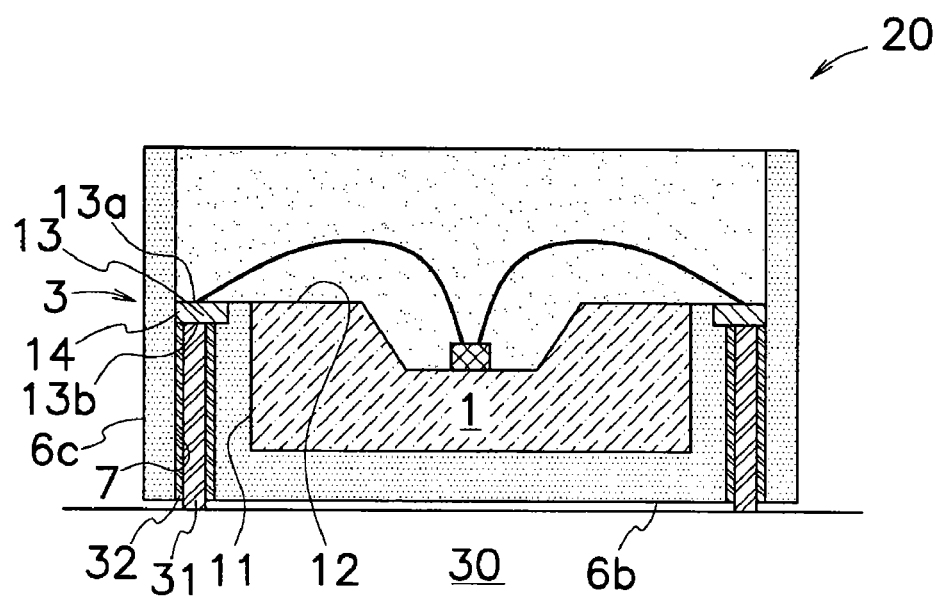
FIG. 14 is a sectional view of a light emitting diode showing a different embodiment according to the present invention with a circuit substrate having plugs received in openings of a plastic encapsulant for electric connection.

In light emitting diode 10 shown in FIG. 11, an insulator 9 extending laterally or widthwise of support plate 1, is attached on top surface 12, mounting surface 12a and inner slant surfaces of inner side walls 12b of support plate 1, and two metallic films 26 are secured in separated relation to each other on insulator 9. In turn, a pair of wiring conductors 3 are bonded on metallic films 26 for electric connection between bottom surface 3b of wiring conductors 3 and metallic films 26. A pair of bottom electrodes (bump electrodes) 2b of light emitting diode chip 2 are electrically and separately connected to metallic films 26 via brazing material such as solder 27. As an alternative, as shown in FIG. 12, one ends 13 of wiring conductors 3 can be extended inwardly and attached on insulator 9 over support plate 1 to electrically connect each bottom electrode 2b of light emitting diode chip 2 with upper surface 13a of one end 13 of wiring conductor 3 by means of brazing material 27 while eliminating metallic films 26. Light emitting diode 10 shown in FIG. 13 comprises two lead wires 4 for separately electrically connecting a pair of top electrodes 2a of light emitting diode chip 2 with upper surface 3a of opposed wiring conductors 3. In this case, bottom surface 15 of support plate 1 may be covered with plastic encapsulant 6.

In light emitting diodes 10 shown in FIGS. 1 to 13, bottom surface 15 of support plate 1 and the other ends of one or either of wiring conductors 3 are electrically connected to wiring patterns formed on a circuit substrate or board 30 to supply electric power to light emitting diode chip 2. On the contrary, light emitting diode 20 shown in FIG. 14 comprises plastic encapsulant 6 formed with openings 7 into which upwardly extending plugs 31 on circuit board 30 are inserted to electrically connect wiring conductors 3 and plugs 31 and thereby electrically connect wiring conductors 3 and wiring patterns on circuit board 30 through plugs 31. For example, plugs 31 are formed of metallic pins, shafts or rods which upwardly extend from circuit board 30 and have their complementary shape to openings 7 of plastic encapsulant 6. Accordingly, electric power can be supplied to light emitting diode chip 2 from circuit board 30 through plugs 31 in openings 7 and wiring conductors 3. Also, fitting of plugs 31 into openings 7 of plastic encapsulant 6 can facilitate proper positioning of light emitting diode 10 relative to circuit board 30. Light emitting diode 10 shown in FIGS. 1 to 13 has wiring conductors 3 the other ends 14 of which are extended and electrically connected to circuit board 30 to supply electric power to light emitting diode chip 2. Unlike this, the embodiment shown in FIG. 14 has wiring conductors 3 whose one ends 13 are directly and electrically connected to circuit board 30 through plugs 31 to provide a small-sized light emitting diode 20 without projected ends 14 of wiring conductors 3 from plastic encapsulant 6, however, the other ends 14 may be exposed to the outside from outer side surface 6c of plastic encapsulant 6. In addition, brazing material 32 such as solder may be filed in a gap around plug 31 in opening 7 of plastic encapsulant 6.

Embodiments of light emitting diodes 10 and 20 according to the present invention are provided with eight light emitting diode chips 2 and sixteen wiring conductors 3 disposed on opposite sides of diode chips 2, and these arrangements can be modified as needed, and diode chips 2 may include those for emitting a single color light or plural color lights such as blue light, red light and green light. Two openings 7 are formed in plastic encapsulant 6 adjacent to opposite longitudinal side surfaces 11 of support plate 1, but number and shape of openings 7 are not limited to the foregoing embodiments and can be altered in accordance with various requirements and conditions such as shape and brightness of light emitting diodes 10 and 20.

As mentioned above, the semiconductor light emitting device according to the present invention can effectively release heat from semiconductor light emitting element 2 to the outside through wiring conductors 3 and openings 7 when a large current is supplied to semiconductor light emitting element 2 to turn it on with a high brightness. The present invention is preferably applicable to semiconductor light emitting device which has wiring conductors electrically connected to electrode of semiconductor light emitting element and a plastic encapsulant for sealing at least a portion of wiring conductors.

What is claimed are:

1. A semiconductor light emitting device comprising:
   a support plate having a pair of longitudinal side surfaces, a pair of lateral side surfaces and a top surface,
   a plurality of wiring conductors disposed in parallel to each other adjacent to at least one of the longitudinal side surfaces of said support plate,
   a plurality of semiconductor light emitting elements mounted on the top surface of said support plate and electrically connected respectively to the wiring conductors, and
   a plastic encapsulant for sealing at least the longitudinal side surfaces and lateral side surfaces of said support plate, and each one end of said wiring conductors,
   wherein each of said wiring conductors has one end electrically connected to an electrode of said semiconductor light emitting element and the other end extending away from said support plate to out of said plastic encapsulant,
   said plastic encapsulant has at least one opening upwardly extending from a bottom surface of said plastic encapsulant and between said one of the longitudinal side surfaces of said support plate and an outer surface of said plastic encapsulant, said opening being formed along said one of the longitudinal side surfaces of said support plate to define a pocket of rectangular parallelepiped shape to expose a bottom surface of said wiring conductors to the outside of said plastic encapsulant, and
   said plastic encapsulant has a connection located in each gap defined between adjoining wiring conductors opened to said pocket.

2. The semiconductor light emitting device of claim 1, further comprising a lead wire for electrically connecting the top electrode of said semiconductor light emitting element with an upper surface of each one end of said wiring conductors,
   wherein said opening exteriorly exposes the bottom surface of each one end of said wiring conductors.

3. The semiconductor light emitting device of claim 1, wherein each one end of said wiring conductors is disposed adjacent to the top surface of said support plate to electrically connect the one end of said wiring conductors with a bottom surface of said semiconductor light emitting element,
   said opening exteriorly exposes a bottom surface of an intermediate portion between said one and the other ends of said wiring conductors.

4. The semiconductor light emitting device of claim 1, wherein said plastic encapsulant has an extension upwardly extruded from top surface of said support plate along the outer surface of said plastic encapsulant to provide an elongation wall for surrounding said semiconductor light emitting element to form a cavity encircled by said elongation wall,
   a light-transmissive resin filled in said cavity seals at least top surface of said support plate, semiconductor light emitting element and upper surface of said wiring conductors.

5. The semiconductor light emitting device of claim 1, further comprising a circuit substrate having at least one plug upwardly extending from said circuit substrate,
   wherein said plug is located in said opening for electrical connection to said wiring conductor to electrically connect said wiring conductor to said circuit substrate through said plug.

6. The semiconductor light emitting device of claim 1, wherein said connection has a flat bottom surface flush with the bottom surface of said wiring conductors.

7. A semiconductor light emitting device comprising:
- a support plate having a pair of longitudinal side surfaces, a pair of lateral side surfaces shorter than the longitudinal side surfaces and a top surface,
- two sets of wiring conductors disposed in parallel to each other, each set of the wiring conductors being adjacent to the corresponding longitudinal side surface of said support plate,
- a plurality of semiconductor light emitting elements mounted on the top surface of said support plate and electrically connected respectively to the wiring conductors, and
- a plastic encapsulant for sealing at least the longitudinal side surfaces and lateral side surfaces of said support plate, and each one end of said wiring conductors,
- wherein each of said wiring conductors has one end electrically connected to an electrode of said semiconductor light emitting element and the other end extending away from said support plate to out of said plastic encapsulant,
- said plastic encapsulant has two openings each upwardly extending from a bottom surface of said plastic encapsulant, said openings being formed along said the longitudinal side surfaces of said support plate and between said longitudinal side surfaces of said support plate and outer surfaces of said plastic encapsulant to define two pockets of rectangular parallelepiped shape to expose a bottom surface of each set of the wiring conductors to the outside of the plastic encapsulant, and
- said plastic encapsulant has connections located between adjoining wiring conductors opened to said pockets.

* * * * *